United States Patent [19]

Kurafuji et al.

[11] Patent Number: 4,779,227
[45] Date of Patent: Oct. 18, 1988

[54] SEMICONDUCTOR MEMORY DEVICE

[75] Inventors: Setsuo Kurafuji, Yokohama; Keizo Aoyama, Yamato; Hideo Itoh, Kawasaki, all of Japan

[73] Assignee: Fujitsu Limited, Kanagawa, Japan

[21] Appl. No.: 895,641

[22] Filed: Aug. 12, 1986

[30] Foreign Application Priority Data

Aug. 16, 1985 [JP] Japan .................. 60-179443

[51] Int. Cl.4 ................................ G11C 5/06
[52] U.S. Cl. ......................... 365/63; 365/51
[58] Field of Search ............ 365/51, 63, 189, 200

[56] References Cited

U.S. PATENT DOCUMENTS 3,936,812  2/1976  Cox et al. .................. 365/63

Primary Examiner—Joseph A. Popek
Attorney, Agent, or Firm—Armstrong, Nikaido, Marmelstein & Kubovcik

[57] ABSTRACT

A semiconductor memory device having data buses for connecting memory cells in memory cell arrays with input/output buffer circuit includes a plurality of memory cell arrays having repetitive patterns. In the device, a plurality of column decoders are adjacent to the memory cell arrays and have repetitive patterns. A portion of the column decoders is displaced from a regular location in the column decoder to a separate location on a substrate of the semiconductor memory device to leave a blank portion in the column decoder. The device also includes an input/output buffer circuit, data buses for connecting the memory cell arrays to the corresponding input/output buffer circuit through spaces outside the column decoders including the blank portion, and conductors for connecting the displaced portion of column decoders located in the separate location to the corresponding memory cell arrays through spaces outside the column decoders including the blank portion.

5 Claims, 5 Drawing Sheets

SEMICONDUCTOR MEMORY DEVICE

BACKGROUND OF THE INVENTION

1. Field of the Invention

The present invention relates to a semiconductor memory device having an improved pattern layout, and more particularly, to a random access memory (RAM) having an improved pattern arrangement suitable for a more rapid operation.

2. Description of the Related Arts

In general, a semiconductor memory device is composed of a word line which is controlled by a row decoder (X decoder) and a pair of bit lines which are controlled by a column decoder (Y decoder). A memory cell is located at a point of intersection between the word line and the pair of bit lines and is selected to connect with a pair of data buses and then exchanges data through an input/output buffer circuit. Of course, the great many memory cells which constitute a memory cell are arranged in a matrix form and the matrix array is arranged with a minimum pitch width.

In recent years an input/output buffer circuit in a semiconductor memory device often has a multi-bit constitution, for example, a 16K-bits constitution, such as 2K×8 bits or 4K×4 bits, and so on, a plurality of input/output terminals must be provided in the input-/output buffer circuit.

In a random access memory having a multi-bit constitution type of input-output buffer circuit, a column decoder is composed of blocks of column decoders corresponding to a respective cell array. The blocks of column decoders are of the same width and the same pitch as a respective cell array, and are arranged adjacent to a respective corresponding cell array.

As described above, the respective block of column decoders corresponding to a respective cell array is arranged in close contact therewith, so there is not sufficient spare space to provide surplus wiring. Accordingly, the data buses which connect a separate cell array to an input/output buffer circuit including a sense amplifier, a write amplifier, and so on, must make a detour to the column decoders, with the result the chip scale or wiring capacity is increased, causing a reduction in the switching speed.

SUMMARY OF THE INVENTION

It is an object of the present invention to provide a semiconductor memory device in which a random access memory having an improved pattern is provided to achieve a more rapid operation.

According to the present invention, there is provided a semiconductor memory device having data buses for connecting memory cells in memory cell arrays with input/output buffer circuits, the device including: a plurality of memory cell arrays having repetitive patterns; a plurality of column decoders adjacent to the memory cell arrays and having repetitive patterns, a portion of the column decoders being displaced from a regular location in the column decoder block to a separate location on a substrate of the semiconductor memory device to leave a blank portion in the column decoder block; an input/output buffer circuit means; a data bus means for connecting the memory cell arrays to the corresponding input/output buffer circuit through spaces outside the column decoder blocks including the blank portion; and conductor means for connecting the displaced portion of the column decoder block located at the separate location to the corresponding memory cell arrays through spaces outside the column decoder block including the blank portion.

By this constitution of a plurality of cell arrays, a column decoder, a blank position, an input/output buffer circuit, data buses, and conductor means as described above, data buses for connecting cell arrays to an input/output buffer circuit can pass through the blank portion from which a portion of the column decoder blank is displaced to be formed at that site, so there is no need to make a long detour. Therefore, the scale of the chip can be diminished and the wiring capacity decreased to improve the operation speed of the memory unit.

BRIEF DESCRIPTION OF THE DRAWINGS

The invention will now be described by way of example with particular reference to the accompanying drawings wherein.

DESCRIPTION OF THE PREFERRED EMBODIMENTS

The invention will now be described in detail below with the aid of an embodiment and with reference to the appended drawings.

Figure 1:
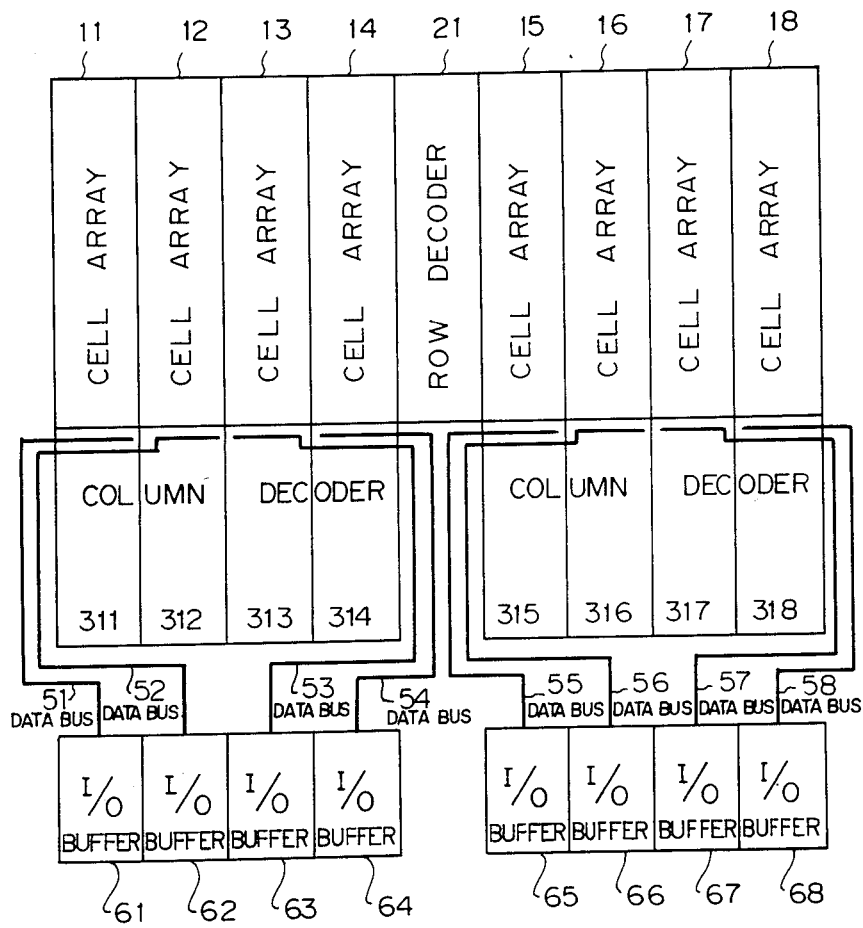
FIG. 1 is a block diagram showing an arrangement of a prior art RAM.

FIG. 1 is a block diagram of a prior art semiconductor memory device, for example, a RAM having a multi-bit input/output buffer circuit constitution.

Figure 2:
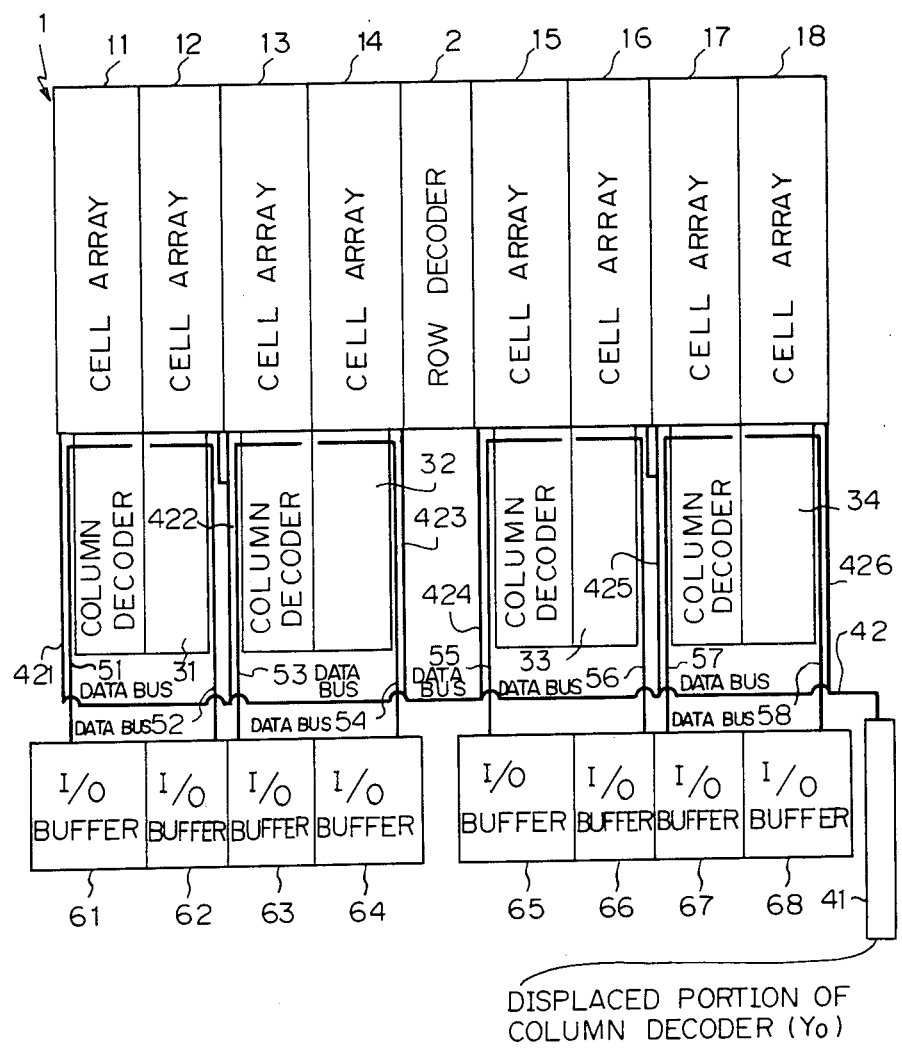
FIG. 2 is a partial, explanatory block diagram of an embodiment in accordance with the present invention.

FIG. 2 is an explanatory block diagram of an embodiment in accordance with the present invention. The same components as illustrated with respect to FIG. 2 are denoted by the same symbols in FIG. 1.

Figure 5:
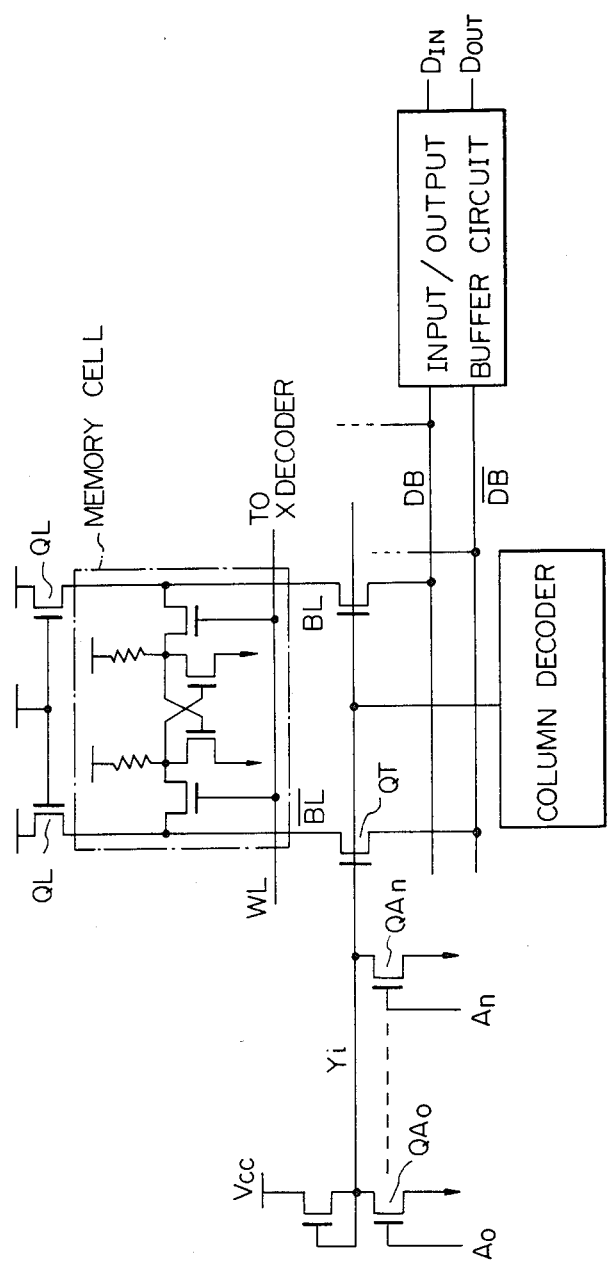
FIG. 5 is a circuit diagram of an arrangement of FIG. 2.

In FIG. 1, 21 denotes a row decoder, 11 to 14 and 15 to 18 denote a separate cell array of 2K-bits, 311 to 318 a column decoder, reference numerals 61 to 68 denote input/output buffer circuit, 51 to 58 respective data buses from the cell array to the I/O (an input output buffer circuit). Separate data buses 51, 52, . . . 58 are composed with a pair of data buses DB and DB as shown in FIG. 5.

In FIG. 2, data buses are shown as a single line to simplify the drawing. But it should be noted that a data bus in FIG. 2 is actually constituted by a pair of data bus lines.

The difference between FIG. 2 describing the embodiment of the present invention and FIG. 1 describing the prior art is that the data terminals of each cell arrays are connected to the data bus 42 via a separate wire 421, 422 . . . 426, and a detour of data buses 51, 52, . . . 58 is avoided. Data buses 52 and 53 pass through the space between the column decoders 31 and 32 into input/output buffers 62 and 63, respectively, while data buses 56 and 57 also pass through the space between the column decoders 33 and 34 into input/output buffers 66 and 67, respectively.

The space or opening for the data buses 52 and 53 or 56 and 57 to pass through is formed in the following way.

Figure 3:
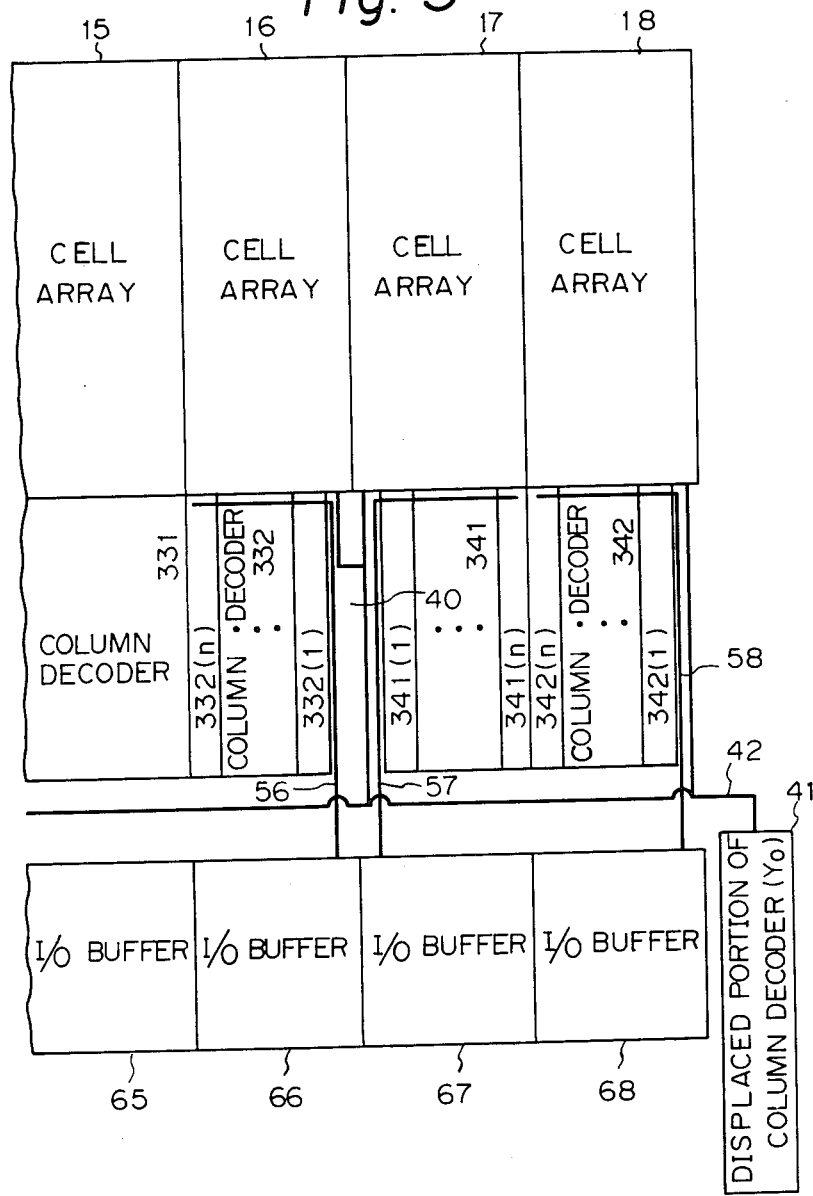
FIG. 3 is a partially enlarged block diagram of FIG. 2.

FIG. 3 is an enlarged block diagram showing the arrangement of the semiconductor memory device in FIG. 1.

In FIG. 3, a column decoder 332 is a block corresponding to a cell array 16 in the column decoder 33, which is composed of column decoders 331 and 332, and column decoder 341 is a block corresponding to a cell array 17 in the column decoder 34, which is composed of column decoders 341 and 342.

$Y_0$, $Y_1$ to $Y_n$ denote a set of sub-blocks which are arranged in the block of column decoders 332 or 341 responsive to each one cell array, for example, 16 or 17 and output a No. 0 to No. n Y-direction address signal, respectively.

Note, at the lower part of a plurality of column decoders, there is generally provided a column address buffer and a control signal generator (both not shown rn the figure), as well as a plurality of input/output buffers, for instance, 65 to 68.

In FIG. 3, a blank position 40 is formed after a portion $Y_0$ of the column decoders is displaced to a new position 41 and the blank position 40 is utilized for passing through the wiring, for example, 56, 57 and 425, thus the detour through blank portions reduces the scrambling of data buses and accordingly the diminishing of the chip area and the decrease of the wiring capacity are accomplished to obtain a much higher speed of operation of a memory.

Figure 4:
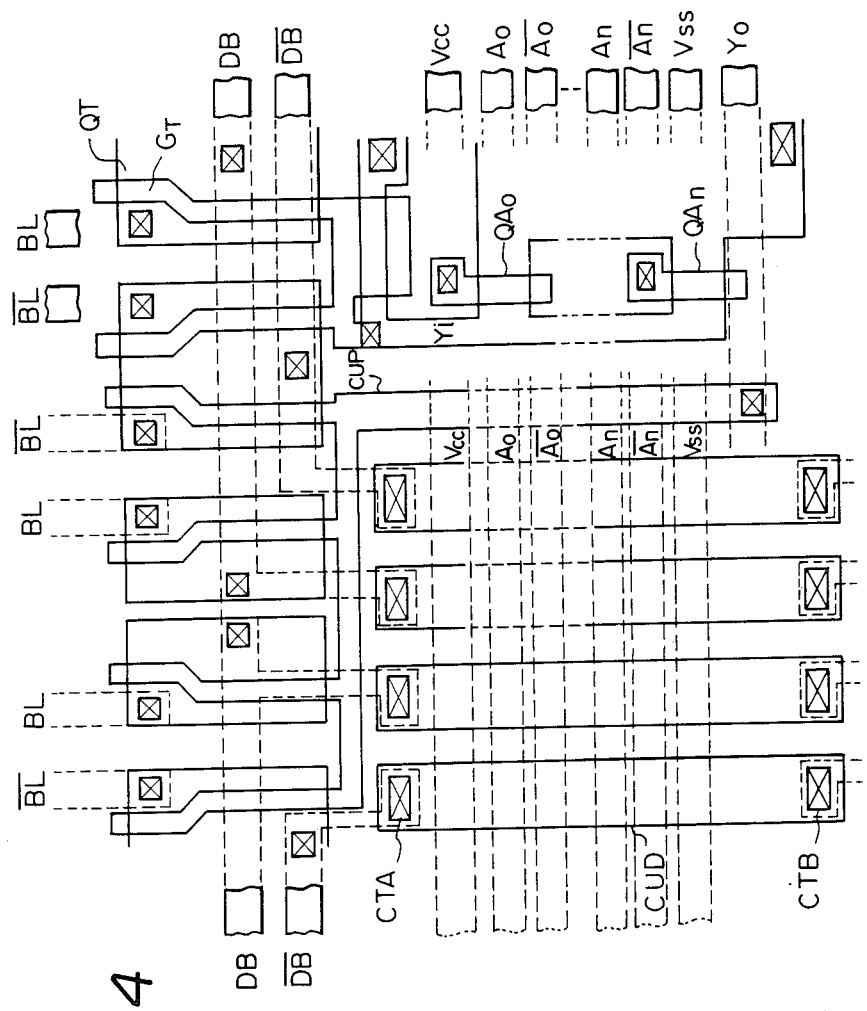
FIG. 4 is a block diagram showing a pattern layout of the semiconductor memory device for an arrangement of FIG. 2.

As is apparent from FIG. 3 and FIG. 4, in the embodiment of the present invention, a sub-block $Y_0$ (41) is formed apart from a normal location 40 (FIG. 3), which is selected when all the signals in the address signal lines $A_0$ to $A_n$ are zero in the blocks of column decoders 332 and 341. Accordingly, because of the remote disposal of $Y_0$ 41, a so-called cross-under wiring, for example, data buses 56 (or the remains of a pair) and 57 (or the remains of a pair) which are composed of a wiring in the diffusion region or by means of polycrystal silicon (Si) are passed therethrough in the blank position and the wiring from a sub-block $Y_0$ through a cell array 16 and 17 is also passed through.

In this case, if a sub-block in a block of column decoders 332 and that in a block of column decoders 341 are so arranged that a sub-block $332(1)_1$ of a column decoder 332 and a sub-block $341(1)_1$ of a column decoder 341 are adjoining, free space for two blank portions is obtained for the arrangement of data buses. In the manufacturing technology, it is quite easy to arrange a sub-block $Y_0$ 41 in the right position apart from a normal location as mentioned above (FIG. 3).

FIG. 4 is an explanatory block diagram of one embodiment showing a pattern layout of the semiconductor memory chip. In the figure, CUD denotes a cross-under wiring by means of a diffusion region, CTA a contact region with the cross-under wiring and data bus, CTB a contact region with a cross-under wiring and a metal wiring toward an input/output buffer circuit, and CUP a cross-under wiring by means of polycrystalline silicon.

The cross-under wiring CUD may be formed by polycrystalline silicon wiring.

As is apparent from FIG. 4, in the embodiment of the present invention, four crossunder wirings CUD plus one crossunder wiring CUP, i.e., five wirings, are passed through an empty space from where a sub-block $Y_0$ of the column decoder is displaced to a separate location.

A so-called multi-bit constitution of a semiconductor storage device which has a plurality of input/output terminals is described in this embodiment, but in a single-bit constitution of a semiconductor memory device which has only one input/output terminal, a cell array is divided into a plurality of blocks in the inner part of a chip and a plurality of data buses and input/output buffers are often provided corresponding to the respective block. The present invention is, of course, adapted to also apply to such a case.

A static RAM wherein the data bus is composed of a pair of data bus DB and barred data bus $\overline{DB}$ is described in the before-described example, but, of course, the present invention is applicable to a semiconductor memory device or a dynamic RAM which is composed of a single data bus.

FIG. 5 is an explanatory circuit diagram of a conventional semiconductor memory device. In the figure, BL and $\overline{BL}$ denote bit lines, WL denotes a word line, QL a load transistor, QT a transfer gate transistor, MC a memory cell CD a column decoder (Y decoder), DB or $\overline{DB}$ a data bus, IN/OUT an input/output buffer circuit, and $D_{IN}$ or $D_{OUT}$ respective input or output data terminals.

In this memory device, a word line WL is controlled by a row decoder (X decoder), and bit lines BL and $\overline{BL}$ are controlled by a column decoder CD. A memory cell MC, which lies in the intersection between the word line WL and bit lines BL and $\overline{BL}$, is selected to be connected to data buses DB and $\overline{DB}$, and thus data transmission and reception can be carried out through an input and output buffer circuit IN/OUT. A number of memory cells MC are arranged in a form of matrix array and the matrix array has a minimum pitch in order to decrease the chip area.

At the lower part of the memory cell in FIG. 5, $Y_i$ denotes an output line of the column decoder, $A_0$ to $A_n$ denote address signal lines, $Q_{A0}$ to $Q_{An}$ denote address transistors, and $V_{cc}$ denotes the power supply line of the positive side power source line.

We claim:

1. A semiconductor memory device, comprising:
   a plurality of substantially parallel memory cell arrays, each memory cell array having a plurality of parallel columns, wherein said plurality of columns are regularly disposed at a first predetermined interval;
   a plurality of substantially parallel column decoder arrays, each column decoder array having a plurality of parallel column decoders, wherein said plurality of column decoders are regularly disposed at a second predetermined interval;
   a plurality of parallel data transfer means, each operatively coupled with a corresponding one of said plurality of columns, for transferring data from memory cells in said columns, each of said plurality of data transfer means being connected to a corresponding one of said column decoders; and
   a data bus means connected to said plurality of data transfer means, for communicating data between said memory cells of said columns and an input/output buffer circuit;
   wherein said first predetermined interval is larger than said second predetermined interval, and said plurality of memory arrays, said plurality of data transfer means, and said plurality of column decoders are respectively aligned in an end-to-end fashion, such that a space is formed between at least two adjacent column decoder arrays, and one of said data bus means extends in said space.

2. A device according to claim 1, wherein said device has a single bit constitution.

3. A device according to claim 1, wherein said data bus means is composed of a single data bus.

4. A device according to claim 1, wherein said device is a dynamic random access memory and said data bus means is a single data bus.

5. A device according to claim 1, wherein each column decoder array is composed of a set of n column decoders for outputting a respective Y-direction address signal to a corresponding one of said data transfer means.

* * * * *